United States Patent [19]
Shioi et al.

[11] Patent Number: 5,837,214
[45] Date of Patent: Nov. 17, 1998

[54] METHOD FOR PRODUCING CUBIC BORON NITRIDE

[75] Inventors: Kousuke Shioi; Tomoyuki Masuda; Hidefumi Nakano, all of Shiojiri, Japan

[73] Assignee: Showa Denko K.K., Tokyo, Japan

[21] Appl. No.: 861,016

[22] Filed: May 21, 1997

[30] Foreign Application Priority Data

May 21, 1996 [JP] Japan .................................. 8-125712

[51] Int. Cl.$^6$ .......................................... C01B 21/064
[52] U.S. Cl. ......................................................... 423/290
[58] Field of Search ............................................ 423/290

[56] References Cited

U.S. PATENT DOCUMENTS 5,618,509  4/1997  Shioi et al. ............................... 423/290

FOREIGN PATENT DOCUMENTS 604073  6/1994  European Pat. Off. ............... 423/290

*Primary Examiner*—Wayne Langel
*Attorney, Agent, or Firm*—Sughrue, Mion, Zinn, Macpeak & Seas, PLLC

[57] ABSTRACT hBN is converted to cBN by keeping it under temperature and pressure conditions within the range of stability of cubic boron nitride, in the presence of at least one compound selected from carbides of alkali metals and alkaline earth metals, or in the presence both of at least one compound selected from carbides of alkali metals and alkaline earth metals and of at least one compound selected from amides and imides of alkali metals and alkaline earth metals.

16 Claims, 1 Drawing Sheet

METHOD FOR PRODUCING CUBIC BORON NITRIDE

BACKGROUND OF THE INVENTION

1. Field of the Invention

The present invention relates to an improved method of synthesizing cubic boron nitride from hexagonal boron nitride.

2. Description of the Related Art

Cubic boron nitride is second only to diamond in hardness but has a greater chemical stability, and therefore it is becoming increasingly more important as a grinding, polishing and cutting material. A variety of methods have been proposed for producing cubic boron nitride, but the most well-known of these, which is widely used industrially, is a method of converting hexagonal boron nitride to cubic boron nitride under the high-temperature, high-pressure conditions of about 5.5 GPa and 1600° C. in the presence of a solvent (catalyst). The well-known solvents (catalysts) for this method have conventionally been nitrides and boronitrides of alkali metals and alkaline earth metals. Of these, lithium-type solvents (catalysts) have been thoroughly studied, and lithium nitride and lithium boronitride are considered to be particularly effective solvents (catalysts) (see, for example, U.S. Pat. No. 3,772,428).

Nevertheless, use of the above mentioned solvents (catalysts) requires high temperature and high pressure to obtain cubic boron nitride in sufficient yields and therefore the above methods are not satisfactory from the industrial point of view. Also, the cubic boron nitrides obtained by use of said solvents (catalysts) have irregular shapes or nearly spherical shapes, poor in development of euhedral planes.

It is an object of the present invention, in the light of these circumstances, to provide a method of converting hexagonal boron nitride to cubic boron nitride with a high yield, using temperatures and pressures lower than the prior art.

DISCLOSURE OF THE INVENTION

In order to achieve the above mentioned object, the present invention provides a method for producing cubic boron nitride which is characterized by keeping hexagonal boron nitride under temperature and pressure conditions within the range of stability of cubic boron nitride, in the presence of at least one carbide selected from the group consisting of carbides of alkali metals and alkaline earth metals, or in the presence both of at least one first compound selected from the group consisting of carbides of alkali metals and alkaline earth metals and of at least one second compound selected from the group consisting of amides and imides of alkali metals and alkaline earth metals, to convert the hexagonal boron nitride to cubic nitride.

The hexagonal boron nitride to be used as the starting material may be commercially available hexagonal boron nitride (hBN) powder. Contaminant oxygen impurities in the form of boron oxide, etc. slow the conversion from hBN to cubic boron nitride (cBN), and thus materials with low oxygen contents are preferred. The granularity thereof is not particularly restricted, but generally 150 mesh or lower is suitable. This is because too great a granularity may result in a lower reactivity with the solvent (catalyst).

The carbides, amides and imides of alkali metals and alkaline earth metals preferably contain few oxygen impurities, as in the case of the hBN starting material, and usually powder of 150 mesh or lower, is used. If the particle size of these compounds is too large, the reactivity with hexagonal boron nitride is lowered.

The carbides of alkali metals and alkaline earth metals used in the present invention are basically $Li_2C_2$, $Na_2C_2$, $K_2C_2$, $Rb_2C_2$, $Cs_2C_2$, $Be_2C$, $BeC_2$, $MgC_2$, $Mg_2C_3$, $CaC_2$, $SrC_2$, $BaC_2$, etc. and the amides and imides of alkali metals and alkaline earth metals used in the present invention are basically $LiNH_2$, $NaNH_2$, $KNH_2$, $RbNH_2$, $CsNH_2$, $Li_2NH$, $Na_2NH$, $K_2NH$, $Rb_2NH$, $Cs_2NH$, $Be(NH_2)_2$, $Mg(NH_2)_2$, $Ca(NH_2)_2$, $Sr(NH_2)_2$, $Ba(NH_2)_2$, $BeNH$, $MgNH$, $CaNH$, $SrNH$, $BaNH$, etc., but solid solutions, complex compounds, non-stoichiometric compounds, etc. of the above compounds may be also used to obtain similar effects.

Preferable compounds as at least one compound selected from carbides of alkali metals and alkaline earth metals are carbides of Li, Mg and Ca. The carbides of alkali metals and alkaline earth metals other than Li, Mg and Ca allow to convert hexagonal boron nitride to cubic boron nitride only at a temperature and pressure higher than those in the case of the carbide of Li, Mg or Ca used. The cubic boron nitride obtainable by using a carbide of Li, Mg or Ca is more excellent in grinding ratio and required power for grinding than that obtainable by the other carbides. Particularly preferable cubic boron nitride is $CaC_2$. When $CaC_2$ is used, cubic boron nitride having an excellent appearance with well developed euhedral planes is obtained, resulting in a high grinding ratio.

Preferable combinations of at least one first compound of carbides of alkali metals and alkaline earth metals with at least one second compound of amides and imide of alkali metals and alkaline earth metals are combinations of at least one carbide of Li, Mg and/or Ca with at least one amide and/or imide of Li, Mg and/or Ca. The amides and imides of alkali metals and alkaline earth metals other than Li, Mg and Ca allow to convert hBN to cBN only at a temperature and pressure higher than those in the case of amide or imide of Li, Mg or Ca used. The cBN obtainable by using an amide or imide of alkali and alkaline earth metals other than Li, Mg and Ca has a grinding ratio and a required power for grinding inferior to those obtainable by an amide or imide of Li, Mg or Ca. to some extent. Particularly preferable combination is $CaC_2$ with at least one amide of Li and Mg. This combination allows to obtain a cBN most excellent in cBN conversion rate at a lower temperature and pressure and its grinding performance.

The present invention is characterized by conducting conversion of hBN to cBN in the presence of at least one carbide of alkali and alkaline earth metals, or in the presence both of at least one first compound from carbides of alkali metals and alkaline earth metals and of at least one secnd compound from amides and imides of alkali metals and alkaline earth metals. In accordance with this process of the present invention, hBN can be converted to cBN with well developed euhedral planes and sharp edges and excellent in cutting action, as a result of the solvent (catalyst) effect of the above compound(s). Also, when a combination of at least one carbide and at least one amide and/or imide of alkali metal(s) and/or alkaline earth metal(s) is used, hBN can be converted to cBN with well developed euhedral planes and sharp edges and excellent in cutting action, under the conditions of relatively lower temperature ad pressure.

It is generally believed that the hBN reacts with various additives, functioning as a solvent, or catalyst, to promote the reaction to cBN, and it is likewise believed that the carbide compound or its combination with amide or imide according to the present invention also functions in the same manner as a solvent or catalyst.

The amount of the at least one carbide of alkali metals and alkaline earth metals used in the present invention is such that the total number of metal atoms making up the additive (the carbides) is 0.1–30 parts, and preferably 0.5–20 parts, to 100 parts by the number of boron atoms making up the hBN (the number of the hBN molecules). If the amount of the additive is less than 0.1 parts, the effect of the additive is not sufficient and production of cBN is lowered. If the amount of the additive or carbide(s) is more than 30 parts, the resultant cBN includes black inclusions, lowering the abrasive performance.

When a combination of at least one first compound from carbides of alkali metals and alkaline earth metals with at least one second compound from amides and imides of alkali metals and alkaline earth metals is used, the total number of metal atoms making up the additives. (the carbide, amide and imide) is 0.2–50 parts, preferably 0.5–40 parts, to 100 parts by the number of the hBN molecules. The ratio of the at least one first compound to the at least one second compound is preferably 70:30 to 5:95, more preferably 50:50 to 5:95, based on the ratio of the metal atoms making up the respective first and second compounds.

If the amount of a combination of the at least one first compound with the at least one second compound is less than 0.2 parts, the effect of the additives is not sufficient and production of cBN is lowered. On the other hand, since there is no improvement in the conversion rate even at greater than 50 parts, it is not economical, and therefore neither situation is preferred.

If the ratio of the at least one first compound from carbides of alkali metals and alkaline earth metals to the at least one second compound from amides and imides of alkali metals and alkali earth metals is more than 70:30, the resultant cBN includes black inclusions, lowering the abrasive performance. If the ratio is below 5:95, the solvent (catalyst) effect of the at least one amide and/or imide of the alkali metals and alkaline earth metals is too high so that the resultant cBN particles are irregular in their shape and the abrasive performance thereof is lowered.

As a preferred mode of combining the above mentioned additives with the hexagonal boron nitride, their powders may be mixed together, but layers of the hexagonal boron nitride and the additives may also be arranged for alternate lamination in a reaction container.

Actually, the hBN and the additive(s), are preferably compacted at about 1–2 t/cm$^2$ pressure, either separately or after being filled into the reaction container. This will have an effect of improving the handleability of the crude powders while increasing the productivity by reducing the amount of shrinkage in the reaction container.

The above compact or laminate may be previously combined with fine particles of cubic boron nitride as a seed, by which crystal growth of cubic boron nitride is accelerated by the above added fine cBN particles as nuclei. This embodiment is included in the present invention. In this case, the seed particles may be coated with the additive(s) of the carbide, amide and/or imide of the present invention.

The reaction container may be a high-temperature, high-pressure generator capable of maintaining crude powders (hBN and additives) or their compacts, etc. under conditions of temperature and pressure in the range of stability of cBN. This range of stability (temperature and pressure) is reported in P. Bundy, R. H. Wentorf, J. Chem. Phys. 38(5), pp.1144–1149, (1963), and in most cases a minimum temperature and pressure of 1100° C. and 3.8 GPa are effective; however, this will vary depending on the types and combination of the additives (solvent, catalyst), and conversion to cBN is also possible at lower than 1100° C. and 3.8 GPa. The retention time is not particularly limited and should be enough to allow the desired conversion rate to be attained, but in most cases it is from about one second to 6 hours.

The hBN is converted to cBN by being kept in the above mentioned stability range, and if the temperature and pressure conditions are extremely high close to 100% conversion rate may be attained; however, usually a composite lump comprising a mixture of hBN and cBN is obtained.

The composite lump is crushed to isolate the cBN. The method used for the isolation may be the one described in Japanese Examined Patent Publication (Kokoku) No. 49-27757, wherein, for example, the composite lump is crushed to a size of 5 mm or smaller, preferably 1 mm or smaller, after which sodium hydroxide and a small amount of water are added thereto and heating is effected to about 300° C. to selectively dissolve the hBN, and thus upon cooling, acid cleaning and filtration the cBN is obtained.

EXAMPLES

Figure 1:
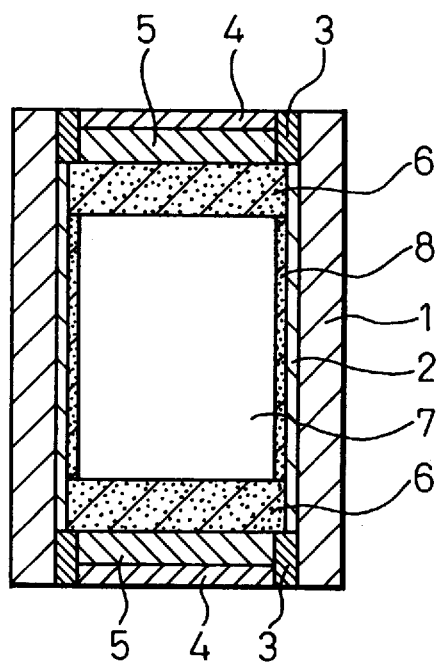
FIG. 1 shows a sectional view of a reaction container used for converting hBN to cBN in the Examples.

Various additives or elemental metals were added to hexagonal boron nitride with a granularity of 150 mesh or lower and containing, as impurities, 0.8 wt % of oxygen and 0.2 wt % of a metal impurity other than an alkali metal or alkaline earth metal, in the amount as shown in the following tables. The amounts of the additive shown in the tables are the ratio of the total number of the metal atoms making up the added additive or elemental metal to the number of hexagonal boron nitride molecules. This mixture was subjected to 1.5 ton/cm$^2$ pressure to make a 26 mm$\phi$×32 mmh compact, which was kept in the reaction container shown in FIG. 1.

In the reaction container shown in FIG. 1, the outer wall 1 of the container is made of pyrophyllite as a pressure conveyor, and is a cylindrically shaped, while the inner side thereof is provided with a heater 2 consisting of a graphite cylinder and pyrophyllite 8 as a partitioning material. Also, the top and bottom ends of the container are each provided with a conducting steel ring 3 and a conducting steel plate 4, while the inner sides thereof are provided with a sintered alumina plate 5 and pyrophyllite 6 as a pressure conveyor, and the space surrounded by this pyrophyllite 6 and the pyrophyllite 8 as a partitioning material is used as the holding compartment 7 for holding the raw materials for the reaction.

The above mentioned compact was treated for 10 minutes in this reaction container, under conditions as shown in the tables.

The cubic boron nitride may be isolated (purified) by adding sodium hydroxide and a small amount of water to the specimen prepared by crushing to about 1 mm or less in a mortar or the like, heating it to 300° C., following this with cooling, cleaning with distilled water and hydrochloric acid and filtration, and then drying the filtered residue.

Using the obtained cubic-boron nitrides, vitreous bond grinding wheels were manufactured. The grinding wheels had the following compositions and shapes:

| | |
|---|---|
| Grit size of cBN | #170/200 |
| Concentration 100 (rate of grinding wheel) | 25 vol % |
| Porosity | 30 vol % |
| Percentage of bond | 25 vol % |
| Filler (white alundum WA #200) | 20% |
| Shape of grinding wheel | 205 mm φ and 5 mmU 76.2H |

A vitreous bond grinding wheel is a grinding wheel comprising a grit, a vitreous binder and a pore. A grit size of cBN of #170/200 means that the cBN grits pass a sieve having an opening size of 0.090 mm (170 mesh) and are retained on a sieve having an opening size of 0.075 mm (200 mesh) where the number of the sieve is defined in JIS. The term "Concentration 100 (rate of grinding wheel 25 volt)" appearing above means the concentration of cBN in the grinding wheel in vol % is 25 vol %. For a diamond grinding wheel, 4.4 ct/cm$^3$ (diamond grit/grinding wheel) is defined as a concentration of 100. The phrase "percentage of bond" means a percentage of a binder. The designation "205 mmø and 5 mmU 76.2 H" as to the shape of the grinding wheel means that the diameter of the grinding wheel is 205 mmø, the width of the grinding wheel is 5 mm, and the diameter of a central hole for receiving an axis is 76.2 mm.

The cubic boron nitride was mixed with borosilicate glass and a filler, formed into a shape of about 5 mm×3 mm×30 mm and fired in air at 950° C. for 10 hours. The fired bodies were bonded to the periphery of an aluminum wheel to obtain a grinding wheel.

Grinding test were conducted for the obtained grinding wheels by using a surface grinder under the following conditions:

| | |
|---|---|
| Wet surface traverse grinding | |
| Peripheral speed of grinding wheel | 1500 m/min |
| Table speed | 15 m/min |
| Cross feed rate | 2 mm/pass |
| Depth setting | 20 μm |
| Ground material | SKH-51 |

The grinding ratio (stock removal/grinding wheel wear) and the power used therefore were measured and are shown in the following tables.

A portion of the obtained converted lump was crushed in a mortar, and an X-ray powder diffraction instrument was used to determine the conversion rate to cubic boron nitride from the intensity ratio of the diffracted rays of the cubic boron nitride (111) and the hexagonal boron nitride (002) using CuK α-rays, and the conversion rate was determined.

TABLE 1

| Sample | Additive | Amount | Synthesis conditions | Conversion rate (%) | Grinding ratio | Power (W) |
|---|---|---|---|---|---|---|
| Ex. 1 | Li$_2$C$_2$ | 10 | 5.0 GPa - 1400° C. | 49 | 763 | 472 |
| Ex. 2 | MgC$_2$ | 10 | 5.0 GPa - 1400° C. | 54 | 769 | 484 |
| Ex. 3 | CaC$_2$ | 10 | 5.0 GPa - 1400° C. | 43 | 838 | 471 |
| Ex. 4 | Li$_2$C$_2$—CaC$_2$ | 5–5 | 5.0 GPa - 1400° C. | 54 | 815 | 414 |
| Ex. 5 | CaC$_2$—LiNH$_2$ | 4–10 | 4.0 GPa - 1300° C. | 57 | 845 | 415 |
| Ex. 6 | CaC$_2$—Mg(NH$_2$)$_2$ | 4–10 | 4.0 GPa - 1300° C. | 59 | 836 | 419 |
| Ex. 7 | Li$_2$C$_2$—Ca(NH$_2$)$_2$ | 4–10 | 4.0 GPa - 1300° C. | 45 | 826 | 411 |
| Ex. 8 | CaC$_2$—LiNH$_2$—Mg(NH$_2$)$_2$ | 4–5–5 | 4.0 GPa - 1300° C. | 55 | 825 | 407 |
| Ex. 9 | CaC$_2$—Li$_2$NH | 4–10 | 4.0 GPa - 1300° C. | 43 | 790 | 449 |
| Ex. 10 | CaC$_2$—MgNH | 4–10 | 4.0 GPa - 1300° C. | 47 | 796 | 426 |
| Ex. 11 | CaC$_2$—LiNH$_2$—MgNH | 4–5–5 | 4.0 GPa - 1300° C. | 52 | 782 | 450 |

TABLE 2

| Sample | Additive | Amount | Synthesis conditions | Conversion rate (%) | Grinding ratio | Power (W) |
|---|---|---|---|---|---|---|
| Com. ex. 1 | Li$_3$BN$_2$ | 10 | 5.2 GPa - 1440° C. | 52 | 361 | 511 |
| Com. ex. 2 | Ca$_3$B$_2$N$_4$ | 10 | 5.2 GPa - 1440° C. | 52 | 413 | 517 |
| Com. ex. 3 | Li$_3$N | 10 | 5.2 GPa - 1440° C. | 42 | 443 | 517 |
| Com. ex. 4 | Mg | 10 | 5.2 GPa - 1440° C. | 44 | 382 | 531 |
| Com. ex. 5 | YC$_2$ | 10 | 5.0 GPa - 1400° C. | 0 | — | — |
| Com. ex. 6 | TiC | 10 | 5.0 GPa - 1400° C. | 0 | — | — |
| Com. ex. 7 | VC | 10 | 5.0 GPa - 1400° C. | 0 | — | — |
| Com. ex. 8 | Cr$_3$C$_2$ | 10 | 5.0 GPa - 1400° C. | 0 | — | — |
| Com. ex. 9 | Mn$_3$C | 10 | 5.0 GPa - 1400° C. | 0 | — | — |
| Com. ex. 10 | Fe$_3$C | 10 | 5.0 GPa - 1400° C. | 0 | — | — |
| Com. ex. 11 | Co$_2$C | 10 | 5.0 GPa - 1400° C. | 0 | — | — |
| Com. ex. 12 | Ni$_3$C | 10 | 5.0 GPa - 1400° C. | 0 | — | — |
| Com. ex. 13 | ZnC$_2$ | 10 | 5.0 GPa - 1400° C. | 0 | — | — |
| Com. ex. 14 | Al$_4$C$_3$ | 10 | 5.0 GPa - 1400° C. | 0 | — | — |
| Com. ex. 15 | SiC | 10 | 5.0 GPa - 1400° C. | 0 | — | — |

TABLE 3

| Sample | Additive | Amount | Synthesis conditions | Conversion rate (%) | Grinding ratio | Power (W) |
| --- | --- | --- | --- | --- | --- | --- |
| Com. ex. 16 | $YC_2$—$LiNH_2$ | 4–10 | 4.5 GPa - 1350° C. | 23 | 155 | 547 |
| Com. ex. 17 | TiC—$LiNH_2$ | 4–10 | 4.5 GPa - 1350° C. | 22 | 167 | 574 |
| Com. ex. 18 | VC—$LiNH_2$ | 4–10 | 4.5 GPa - 1350° C. | 24 | 157 | 609 |
| Com. ex. 19 | $Cr_3C_2$—$LiNH_2$ | 4–10 | 4.5 GPa - 1350° C. | 33 | 170 | 599 |
| Com. ex. 20 | $Mn_3C$—$LiNH_2$ | 4–10 | 4.5 GPa - 1350° C. | 33 | 156 | 581 |
| Com. ex. 21 | $Fe_3C$—$LiNH_2$ | 4–10 | 4.5 GPa - 1350° C. | 27 | 199 | 597 |
| Com. ex. 22 | $Co_2C$—$LiNH_2$ | 4–10 | 4.5 GPa - 1350° C. | 26 | 203 | 630 |
| Com. ex. 23 | $Ni_3C$—$LiNH_2$ | 4–10 | 4.5 GPa - 1350° C. | 29 | 168 | 626 |
| Com. ex. 24 | $ZnC_2$—$LiNH_2$ | 4–10 | 4.5 GPa - 1350° C. | 31 | 174 | 575 |
| Com. ex. 25 | $Al_4C_3$—$LiNH_2$ | 4–10 | 4.5 GPa - 1350° C. | 34 | 227 | 572 |
| Com. ex. 26 | SiC—$LiNH_2$ | 4–10 | 4.5 GPa - 1350° C. | 0 | — | — |

We claim:

1. A method for producing cubic boron nitride, characterized by keeping hexagonal boron nitride under temperature and pressure conditions within the range of stability of cubic boron nitride in the presence of at least one carbide selected from the group consisting of carbides of alkali metals and alkaline earth metals to convert said hexagonal boron nitride to cubic boron nitride.

2. A method according to claim 1, wherein said at least one carbide is used such that the total number of metal atoms making up the at least one carbide is 0.1–30 parts to 100 parts of the number of molecules of the hexagonal boron nitride.

3. A method according to claim 2, wherein said at least one carbide is used such that the total number of the metal atoms making up the at least one carbide is 0.5 to 20 parts to 100 parts of the number of molecules of the hexagonal boron nitride.

4. A method according to claim 1, wherein said region of stability of cubic boron nitride is selected to have a temperature of 1100° C. or higher and a pressure of 3.8 GPa or higher.

5. A method according to claim 1, wherein a lump comprising the converted cubic boron nitride and the unconverted hexagonal boron nitride is obtained and the lump is crushed, after which sodium hydroxide and water are added thereto and heating is effected to selectively dissolve the hexagonal boron nitride, and then cooling, acid cleaning and filtration are conducted, so as to isolate the cubic boron nitride.

6. A method according to claim 1, wherein said at least one carbide is at least one of carbides of lithium, magnesium and calcium.

7. A method according to claim 1, wherein said at least one carbide comprises $CaC_2$.

8. A method for producing cubic boron nitride, characterized by keeping hexagonal boron nitride under temperature and pressure conditions within the range of stability of cubic boron nitride in the presence of both at least one first compound selected from the group consisting of carbides of alkali metals and alkaline earth metals and of at least one second compound selected from the group consisting of amides and imides of alkali metals and alkaline earth metals, to convert said hexagonal boron nitride to cubic boron nitride.

9. A method according to claim 8, wherein said first and second compounds are used such that the total number of metal atoms making up said first and second compounds is 0.2–50 parts to 100 parts of the total number of molecules of said hexagonal boron nitride.

10. A method according to claim 8, wherein said first and second compounds are used such that the total number of metal atoms making up said first and second compounds is 0.5–40 parts of the total number of molecules of said hexagonal boron nitride.

11. A method according to claim 8, wherein said first and second compounds are used such that a ratio of said first to second compounds is 70:30 to 5:95.

12. A method according to claim 8, wherein said first and second compounds are used such that a ratio of said first to second compounds is 50:50 to 5:95.

13. A method according to claim 8, wherein said first compound is at least one carbide of Li, Mg or Ca and said second compound is at least one amide and/or imide of Li, Mg or Ca.

14. A method according to claim 8, wherein said first compound is $CaC_2$ and said second compound is at least one member selected from the group consisting of amides of Li and Mg.

15. A method according to claim 8, wherein said region of stability of cubic boron nitride is selected to have a temperature of 1100° C. or higher and a pressure of 3.8 GPa or higher.

16. A method according to claim 8, wherein a lump comprising the converted cubic boron nitride and the unconverted hexagonal boron nitride is obtained and the lump is crushed, after which sodium hydroxide and water are added thereto and heating is effected to selectively dissolve the hexagonal boron nitride, and then cooling, acid cleaning and filtration are conducted, so as to isolate the cubic born nitride.

* * * * *